United States Patent [19]

Ludlow

[11] 4,152,174
[45] May 1, 1979

[54] PHOTOELECTRIC CELL USING AN IMPROVED PHOTOELECTRIC PLATE AND PLATE ARRAY

[76] Inventor: Ogden R. Ludlow, 137 Third St., P.O. Box 206, Renovo, Pa. 17764

[21] Appl. No.: 852,512

[22] Filed: Nov. 17, 1977

[51] Int. Cl.$^2$ .......................................... H01L 31/04
[52] U.S. Cl. .............................. 136/89 PC; 136/89 P
[58] Field of Search ............ 136/89 P, 89 PC, 89 AC, 136/89 H

[56] References Cited

U.S. PATENT DOCUMENTS

| 2,951,163 | 8/1960 | Shaffer et al. | 250/212 |
| 3,018,313 | 1/1962 | Gattone | 136/89 |
| 3,419,434 | 12/1968 | Colehower | 136/89 |
| 3,943,726 | 3/1976 | Miller | 62/2 |
| 3,988,166 | 10/1976 | Beam | 136/89 |

Primary Examiner—Aaron Weisstuch
Attorney, Agent, or Firm—Howard I. Podell

[57] ABSTRACT

A solar energy collector using rhombic photoelectric plates arranged in an array of connected plates and mounted in a housing can be positioned on a universal mount which is movable on a tracking servo using a position analyzer and a sun position sensor to direct the positioning of the solar collector housing. A lenticular surface on the cover of the housing can intensify the collection of solar energy within the individual photoelectric plates. A small portable tracking servo unit could be mounted on a camper or in another suitable location or the housing may be attached to a portable radio.

4 Claims, 3 Drawing Figures

PHOTOELECTRIC CELL USING AN IMPROVED PHOTOELECTRIC PLATE AND PLATE ARRAY

I have invented a new and novel plate and plate array which can increase the exposure to the sun of electricity producing solar sensitive plates. My device provides good energy absorption by keeping the multi-facet unit at the maximum efficiency angle to the sun rather than a stationary flat solar collecting unit. My device utilizes a rhombus shaped cell element whose opposite acute angles preferably are 60° in miniature or large elements which may be assembled to form large panels with a clear high transmission glass cover to protect the elements from the effects of the environment. Each element can have two electrical contacts extending from each vortex and apex to conduct the electrical currents generated by these photo electric cells. To further improve the efficiency of this device, a hurricane or universal mount can be used to support the photo electric cell arrays and a tracking device can be used to move the hurricane or universal mount as desired. Lenticular surfaces can be used for the plates and cover glass to improve the solar energy absorption of this device if desired.

This device can be of particular value for farmers to be mounted over and adjacent to their farm fields to collect energy for the use of farm machinery and can be used by sportsmen and campers to operate devices in the camp site and on the vehicles. In addition, this device can be used in connection with portable radios to provide the current to operate the portable radios. Furthermore, these devices can be a great asset in emergency and disaster work.

My invention can be understood in view of the accompanying figures.

Figure 1:
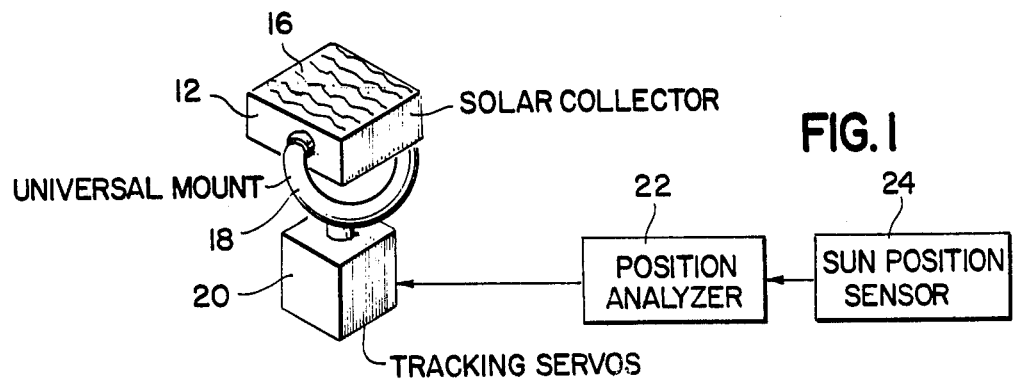
FIG. 1 is an isometric view of the device.
Figure 2:
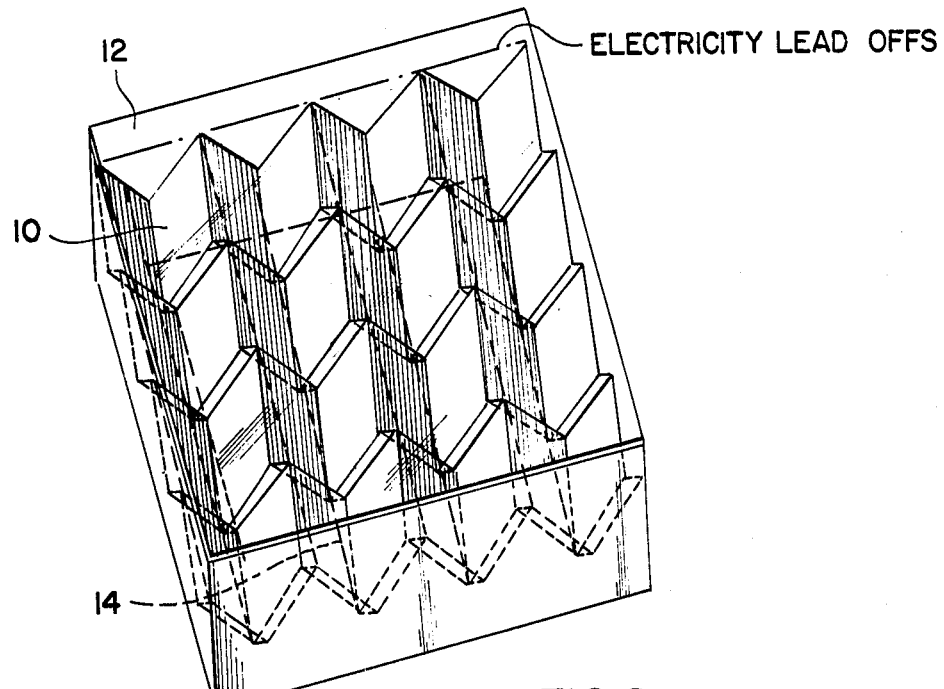
FIG. 2 is a close up top isometric view of the solar collector.
Figure 3:
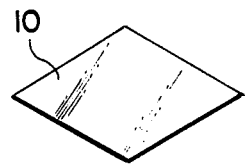
FIG. 3 is a front view of one of the photo electric plate elements.

With regard to FIGS. 1, 2, and 3, a plurality of rhombic photo electric cells 10 are mounted in an array in a housing 12 with electrical leads 14 connected to each of the photo electric cells 10. A cover 16 mounted over the housing 12 permits solar energy to enter and interact with the individual photo electric cells while protecting the cells 10 from the environment. The housing 12 is seen mounted on a universal mount 18 supported by a tracking servo 20 containing a position analyser 22 and a sun position sensor 24 in order that the housing 12 may be properly positioned to fully utilize the energy delivered by the sun.

As shown in FIG. 3 each cell 10 is in the form of a flat plate of rhombic shape. The cells 10 are joined together in an array, as shown in FIG. 2, in which the plate of each cell extends at an angle to the base of the housing 12. The rhombic shape of each cell 10 results in a flat shape of each cell in which two opposed corners of the cell are formed as acute angles and the other two opposed corners are formed as obtuse angles as shown in FIG. 2.

As seen in FIG. 2, the rhomboid-shaped cells are mounted so as to extend at an angle to the base of the housing. Adjacent cells are joined at their edges so as to reflect light from one cell to the other. In this way, light which bounces off one cell may produce electricity when reflected to an adjoining cell.

Having described a preferred embodiment of my invention, it is understood that various changes can be made without departing from the spirit of my invention, and, I desire to cover by the appended claims all such modifications as fall within the true spirit and scope of my invention.

What I claim and seek to secure by Letters Patent is:

1. A solar energy collecting device, comprising an array of photo cell plates mounted in a housing, and means of mounting the housing connected to the housing, wherein each of the photo cells of the array of photo cells is a rhomboid shaped flat photo cell, and with each cell mounted to extend at an angle to the base of the housing.

2. The device of claim 1, wherein an acute angle of each of two opposing corners of each of the photo cell plates is substantially a 60° angle.

3. The device of claim 2, wherein the means of mounting the housing is a universal mounting, and the universal mounting is attached to a tracking servo device.

4. The device of claim 2, wherein the means of mounting the housing is a universal mounting, and the universal mounting is attached to a tracking servo device, and wherein the tracking servo device has a position analyser mounted in the tracking servo device, and a sun position sensor is mounted in the tracking servo device, and is connected to the position analyser.

* * * * *